United States Patent [19]
Jung et al.

[11] Patent Number: 5,208,551
[45] Date of Patent: May 4, 1993

[54] NOISE REDUCTION CIRCUIT WITH A MAIN SIGNAL PATH AND AN AUXILIARY SIGNAL PATH HAVING A HIGH-PASS FILTER CHARACTERISTIC

[75] Inventors: Duck-young Jung, Namdong-ku; Seung-yup Koo, Seoul, both of Rep. of Korea

[73] Assignee: Samsung Electronics Co., Ltd., Kyunggi-do, Rep. of Korea

[21] Appl. No.: 811,148

[22] Filed: Dec. 20, 1991

[30] Foreign Application Priority Data

Jun. 14, 1991 [KR] Rep. of Korea ............... 91-9842

[51] Int. Cl.⁵ ............................................. H03F 1/26
[52] U.S. Cl. ....................................... 330/149; 303/14
[58] Field of Search ..................... 330/149; 333/14; 381/106; 455/72

[56] References Cited

U.S. PATENT DOCUMENTS 4,547,741  10/1985  Katakura ..................... 333/14 X

FOREIGN PATENT DOCUMENTS 182613  10/1984  Japan ..................... 333/14

Primary Examiner—James B. Mullins
Attorney, Agent, or Firm—Rothwell, Figg, Ernst

[57] ABSTRACT

In a noise reduction circuit with a main signal path and an auxiliary signal path having a high-pass filter characteristic, the noise reduction circuit comprises: a voltage-to-current converting circuit having a differential input and output and connecting the auxiliary signal path to the main signal path, PN junction transistors connected to the differential output of the voltage-to-current converting circuit, a paired common-emitter transistor arrangement having one base electrode connected to the PN junction transistors, a capacitance connected to a first differential input of the voltage-to-current converting circuit, a feedback resistor connecting a collector of a first common-emitter transistor pair of the paired common-emitter transistor arrangement to the first differential input of the voltage-to-current converting circuit, a voltage buffer having the collector of the first common-emitter transistor pair of the paired common-emitter transistor arrangement and a voltage dividing resistance connected to a first differential input terminal, and an operational circuit for summing the auxiliary signal and main signal outputs. Accordingly, the circuit can minimize the layout area of an integrated circuit.

3 Claims, 3 Drawing Sheets

NOISE REDUCTION CIRCUIT WITH A MAIN SIGNAL PATH AND AN AUXILIARY SIGNAL PATH HAVING A HIGH-PASS FILTER CHARACTERISTIC

FIELD OF THE INVENTION

The present invention relates to a noise reduction circuit and, more particularly, to a noise reduction circuit with a main signal path and an auxiliary signal path which has a high-pass filter characteristic.

A known noise reduction circuit employs a compression circuit at the transmitter end to compress the signal during transmission, while at the receiver end, an expansion circuit is used for signal expansion during reception, thereby increasing the effective dynamic range of a signal's transmission path. This same signal compression and expansion approach has also been applied to recording and reproduction systems, by which the signal is compressed at the input to the recording device and is expanded during reproduction. These types of compression and expansion systems typically include circuits which have controllable transfer functions that vary depending upon signal level and/or frequency.

A noise reduction circuit disclosed in U.S. Pat. No. 4,547,741 is shown in FIG. 1.

Referring to FIG. 1, the switching between compression and expansion is effected by changing the connection between operational amplifier 1 and the main circuit portion that provides the compression capability. When changeover switch 2 is set to connect terminals a and c, operational amplifier 1 acts as a unity gain amplifier or voltage follower, so that the input signal fed to input terminal 3 is supplied in an unmodified form by operational amplifier 1 to input terminal 4 of the main compression circuit and the compressed output signal is produced at output terminal 5. When switch 2 is set to connect terminals b and c, the compression circuit is connected as an input to operational amplifier 1, so that the portion of the circuit between input terminal 3 and output terminal 5 now performs signal expansion, which is complementary to the signal compression described hereinabove.

Referring to the high-pass filter circuit, the equivalent resistance formed by a voltage-to-current converter 6, a PN junction pair 7, and a first common-emitter transistor pair 8, is not connected directly to ground but is floating, connected to ground only through a capacitor 9. Capacitor 9 is connected to one differential input 10 of voltage-to-current converter 6 with the other differential input 11 being connected to main signal path 12. The output of the first common-emitter transistor pair 8 is also connected to differential input terminal 10 in a feedback circuit configuration. An auxiliary signal path including a high-pass filtering characteristic with a variable cut-off frequency, runs between input terminal 4 and output terminal 5, in parallel with the main signal path. The output from main signal path 12 and the output from auxiliary signal path 13 are summed by operational amplifier 14 and the summed signals are supplied to output terminal 5. Although not shown, the control circuit for varying the cut-off frequency of the high-pass filter in the auxiliary signal path 13 is typically constructed and arranged so that the auxiliary signal path output is sampled, the signal level of the sampled output detected, and the value of the resistance component of the filter circuit portion of the auxiliary signal path is varied depending upon the detected output level.

Differential output terminals 15 and 16 of voltage-to-current converter 6 are connected to the ends of a PN junction pair 7 formed of two transistors connected as diodes and having common connections at the other (cathode) ends.

Also connected, respectively, to terminals 15 and 16 of voltage-to-current converter 6, are the base electrodes of a first pair of transistors 8 connected in a common-emitter configuration. A current inverter or current mirror circuit 17 is connected between the collector electrodes of first common-emitter transistor pair 8 and the output current therefrom is fed back to differential input terminal 10 of voltage-to-current converter 6. Current source 18 is connected to the common-emitter circuit of first common-emitter transistor pair 8, and the current flowing in current source 18 is controlled by the output of the above-described cut-off frequency control circuit (not shown), through control input terminal 19.

The base electrodes of second common-emitter transistor pair 20 are respectively connected to the output terminals 15 and 16 of voltage-to-current converter 6, as are the base electrodes of a third common-emitter transistor pair 21, which provides the high-pass filter output to amplitude limiting circuit 22. Current mirror circuits 23 and 24 are connected as loads to second and third common-emitter transistor pairs 20 and 21, respectively, and second and third current sources 25 and 26 are connected to the common emitter paths of transistor pairs 20 and 21, respectively.

The output current from the collector circuit of second common-emitter transistor pair 20 is the auxiliary signal path output fed to amplitude limiting circuit 22 and on to the inverting input of operational amplifier 14, which functions as the signal path summing means. This auxiliary signal path output is summed with the main signal path output in operational amplifier 14, and the resultant output signal is fed to output terminal 5. The output of third common-emitter transistor pair 21 is taken off at terminal 27 to be supplied to control input terminal 19 through the above-described control circuit (not shown). Terminals 28 and 29 designate plus and minus voltage source connections, respectively.

On construction of a high pass filter, it is necessary to use a capacitance means. However, the deficiency in the above-described circuit is that, when implemented in integrated circuitry, the layout area increases due to the large capacitance.

SUMMARY OF THE INVENTION

It is an object of the present invention to provide a noise reduction circuit which can decrease the layout area of a capacitance when utilized in integrated circuitry.

To achieve the above object, in a noise reduction circuit with a main signal path and an auxiliary signal path having a high-pass filter characteristic, the noise reduction circuit according to the present invention comprises:

voltage-to-current converting means having a differential input and a differential output and connecting the auxiliary signal path to the main signal path;

PN junction means connected to the differential output of the voltage-to-current converting means;

a paired common-emitter transistor arrangement having base electrodes connected to the PN junction means;

capacitance means connected to a first differential input of the voltage-to-current converting means;

feedback means connecting a collector of a first common-emitter transistor pair of the paired common-emitter transistor arrangement to the first differential input of the voltage-to-current converting means;

voltage buffer means having a voltage dividing resistance connected between a collector of the first common-emitter transistor pair of the paired common-emitter transistor arrangement and a first differential input terminal; and operation means for summing the auxiliary signal output and the main signal output.

BRIEF DESCRIPTION OF THE DRAWINGS

The above object of the present invention will become more apparent by describing the preferred embodiments of the present invention with reference to the attached drawings, in which.

DETAILED DESCRIPTION OF THE INVENTION

Figure 1:
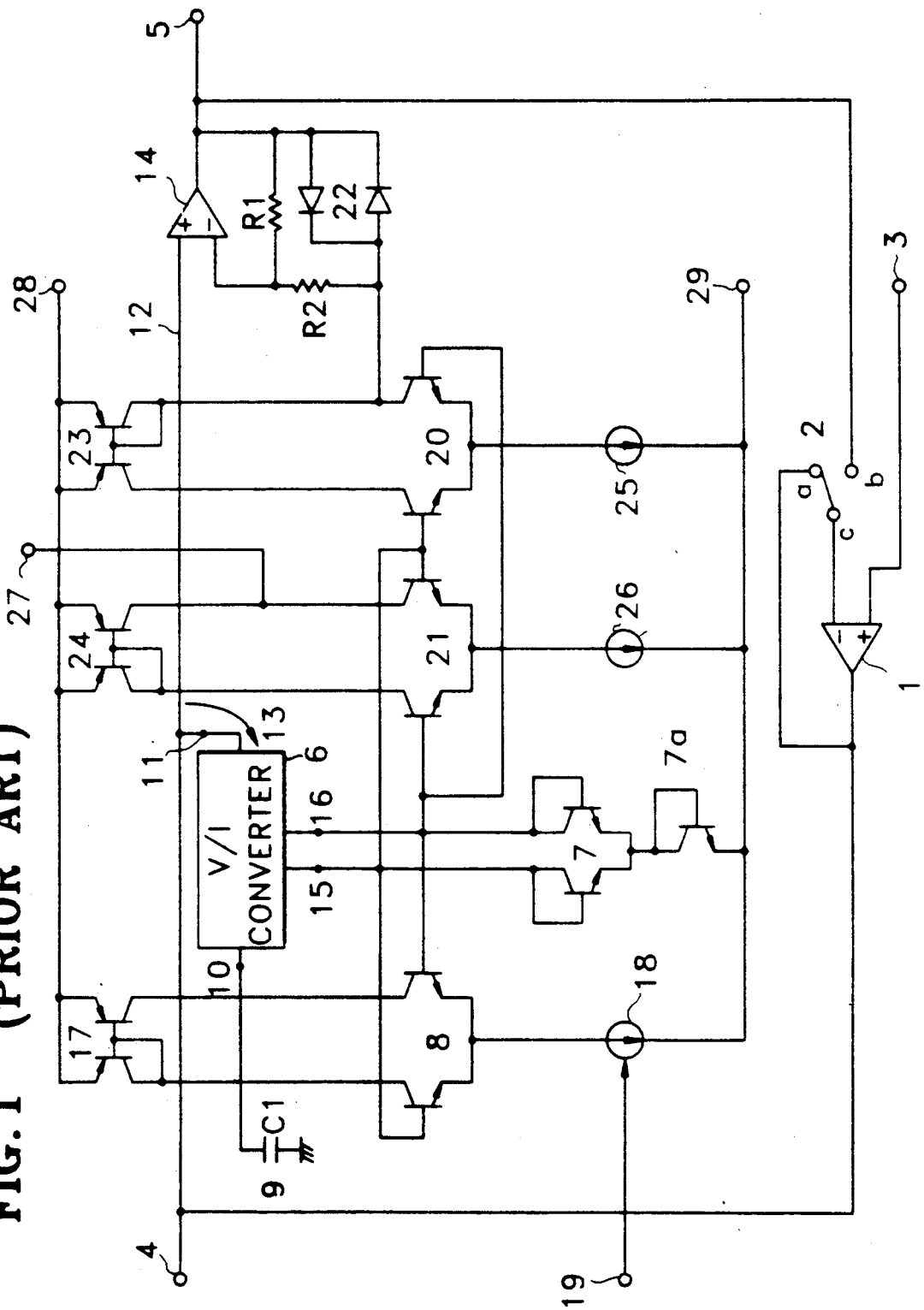
FIG. 1 shows a circuit diagram of a conventional noise reduction circuit.
Figure 2:
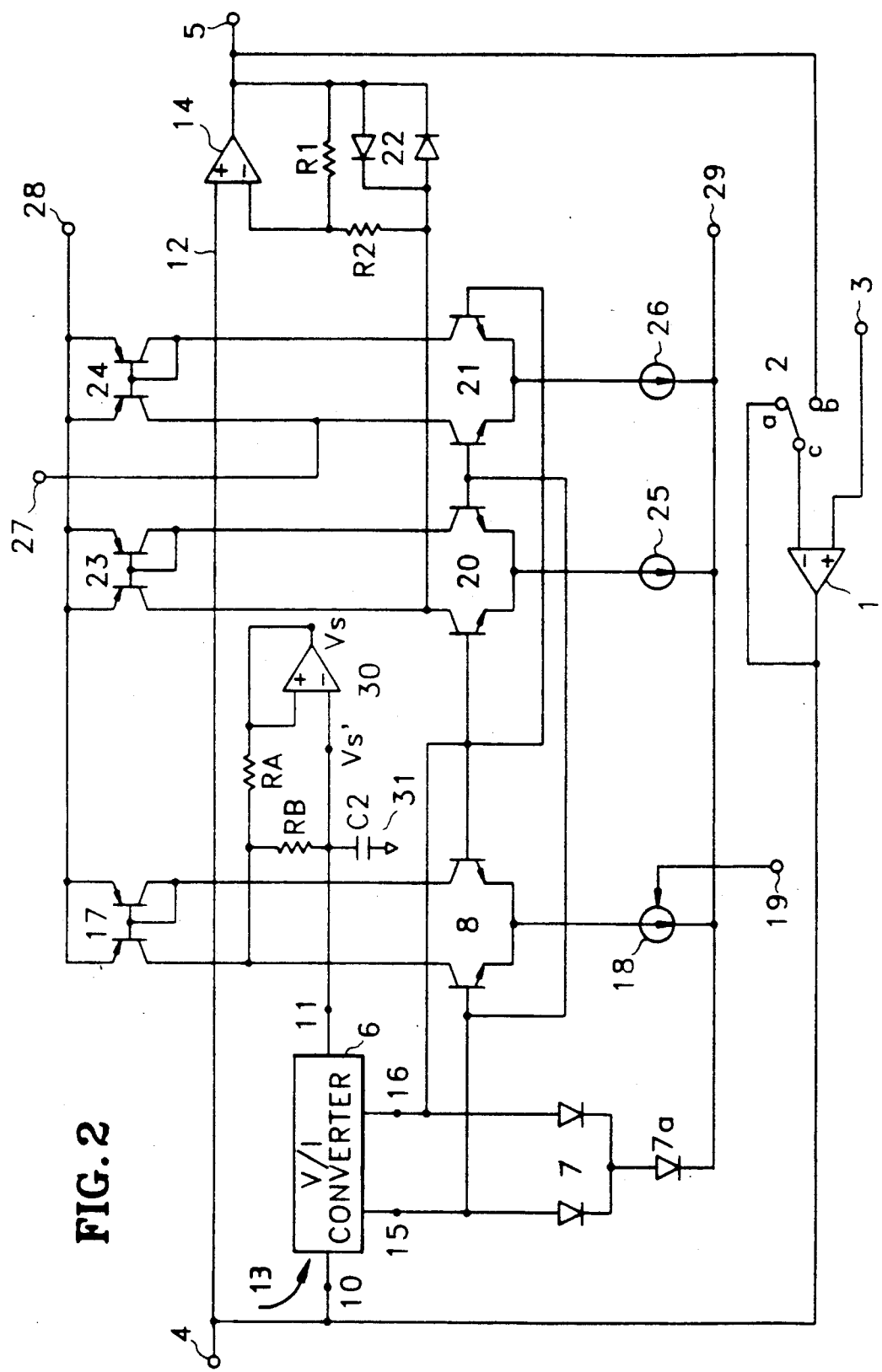
FIG. 2 shows a circuit diagram of one embodiment of a noise reduction circuit according to the present invention.

FIG. 2 shows a noise reduction circuit according to the present invention. The same elements as shown in FIG. 1 are designated by the same reference numerals to avoid duplication of explanation. The circuit shown in FIG. 2 comprises a resistance RB connected between a collector electrode of a first common-emitter transistor pair 8 and a differential input terminal 11 of a voltage-to-current converting means 6, a resistance RA connected between that collector electrode and the non-inverting input of a voltage buffer 30, and the common node of resistance RB and a capacitor 31 connected to the inverting input of voltage buffer 30.

Figure 3B:
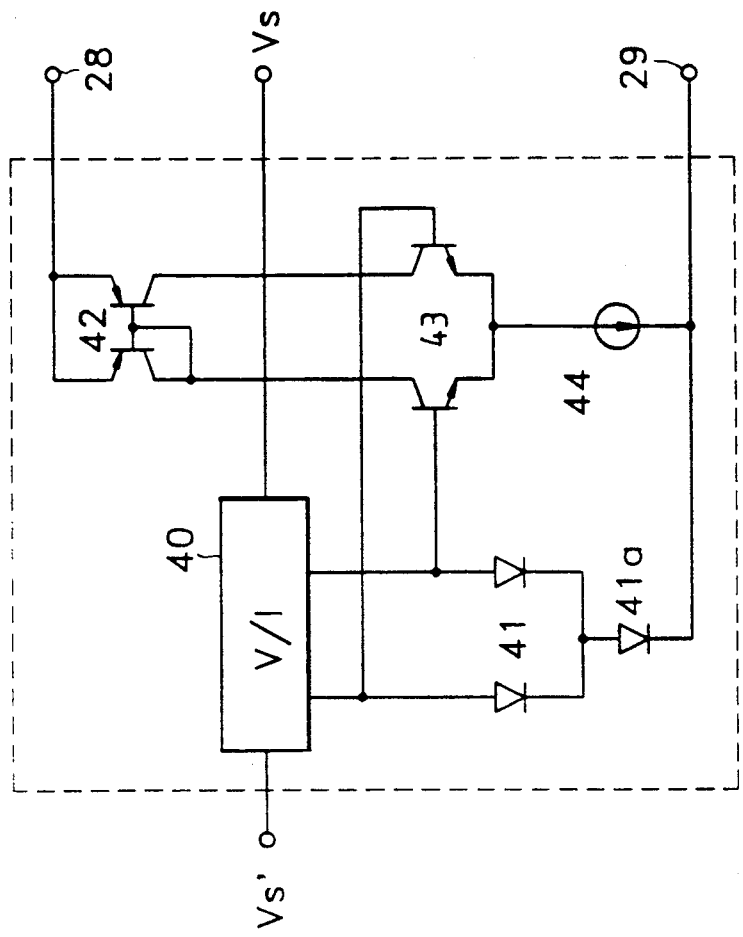
FIG. 3B shows a circuit diagram of another embodiment of a voltage buffer used in the present invention.
Figure 3A:
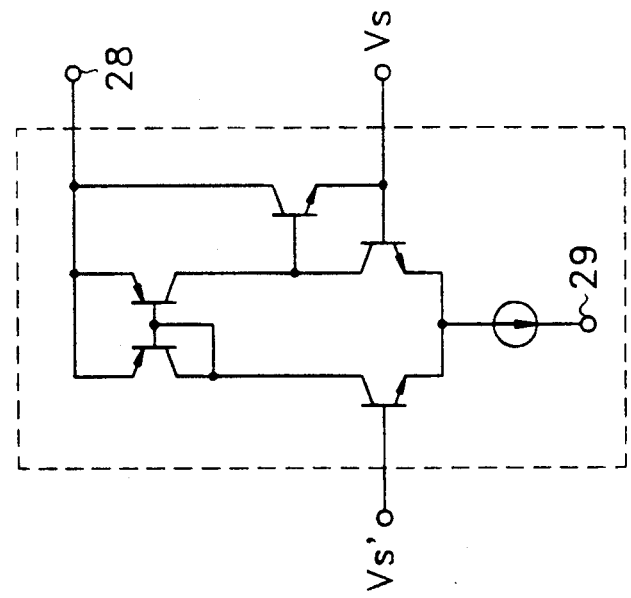
FIG. 3A shows a circuit diagram of one embodiment of a voltage buffer used in the present invention.

FIG. 3A shows a voltage buffer using a differential amplifier which includes a current mirror, a common-emitter transistor pair, a constant current source, and an NPN transistor. An input voltage Vs' is applied to the base of a first transistor of the common-emitter transistor pair, while the base of a second transistor of the common-emitter pair is connected to the emitter of the NPN transistor whose base is tied to the second transistor's collector. The collector of the NPN transistor is connected to a power supply voltage 28. The common node between the second transistor's base and the NPN transistor's emitter supplies a buffered output signal Vs.

FIG. 3B shows a voltage buffer as a portion of the circuit shown in FIG. 2, which uses a voltage-to-current converting means. The voltage buffer includes a voltage-to-current converting means 40, a PN junction transistor pair 41, a current mirror 42, a common-emitter transistor pair 43, and a constant current source 44. A input voltage Vs' is connected to an input terminal of the voltage-to-current converting means, and an output voltage Vs is taken from a differential output terminal of the transistor pair 43.

In the circuit shown in FIG. 1, the voltage relation between an input and an output of a PN junction means can be represented by the following equation:

$$\frac{V_s}{V_i} = gm_1 \cdot rd \left( \frac{S}{S + \frac{gm_1 \cdot gm_2 \cdot rd}{C_1}} \right) \quad \text{(Eq. 1)}$$

where $gm_1$ is the transconductance of the voltage-to-current converting circuit, $gm_2$ is the transconductance of the first common-emitter transistor pair, and $rd$ is the dynamic resistance of the PN junction pair.

Accordingly, the deficiency of FIG. 1 is that the frequency characteristic depends on a transconductance value between the voltage-to-current converting circuit, the first common-emitter transistor pair, and the capacitance.

In the circuit shown in FIG. 2, the voltage relation between an input and an output of a PN junction means is represented here by the following equation:

$$\frac{V_s}{V_i} = gm_1 \cdot rd \left( \frac{S}{S + \left( \frac{gm_1 \cdot gm_2 \cdot rd}{C_2} \right) \frac{RA}{RA + RB}} \right) \quad \text{(Eq. 2)}$$

From Equations 1 and 2, capacitance $C_2$ is equal to the product of capacitance $C_1$ and $RA/(RA+RB)$.

The advantage is that, in integrated circuitry, the reduction of the layout area using a minimum capacitance is better than increasing the layout area by the use of an operational amplifier.

The transfer function shown in Equation 2 is transferred to an operational amplifier 17 as a "k" factor, through the second common-emitter transistor pair.

The voltage at output terminal 5 is obtained by:

$$V_o = V_i + \left( \frac{a \cdot S \cdot V_i \cdot R_1 \cdot k}{S + T(s)\left(\frac{RA}{RA+RB}\right)} \right) \quad \text{(Eq. 3)}$$

$$= V_i(1 + R_1 \cdot a \cdot k) \left( \frac{S + \left(\frac{RA}{RA+RB}\right)\frac{T(s)}{1 + R_1 \cdot a \cdot k}}{S + T(s)\left(\frac{RA}{RA+RB}\right)} \right)$$

where $a = gmGrd$, and $T(s) = gm_1 gm_2 rd/C_2$.

From Equation 3, we know that the noise reduction circuit according to the present invention has one zero and one pole.

Accordingly, the noise reduction circuit according to the present invention can minimize the layout area of an integrated circuit since the location of the zero and pole is determined by a resistance means as shown in Equation 3.

What is claimed is:

1. A noise reduction circuit with a main signal path having a main signal output and an auxiliary signal path having a high pass filter characteristic and having an auxiliary signal output, comprising:

voltage-to-current converting means having at least a first differential input and a differential output and connecting said auxiliary signal path to said main signal path;

PN junction means connected to said differential output of said voltage-to-current converting means;

a paired common-emitter transistor arrangement having base electrodes connected to said PN junction means;

capacitance means connected to said first differential input of said voltage-to-current converting means;

feedback resistance means connecting a collector of a first common-emitter transistor of said paired common-emitter transistor arrangement to said first differential input of said voltage-to-current converting means;

voltage buffer means coupled between said collector of said first common-emitter transistor of said paired common-emitter transistor arrangement and said first differential input;

second resistance means connected between said collector of said first common-emitter transistor and said voltage buffer means; and operation means for summing said auxiliary signal output and said main signal output.

2. A noise reduction circuit as claimed in claim 1, wherein said voltage buffer means comprises:

second voltage-to-current converting means having a first input connected to said first differential input;

a PN junction pair connected to differential outputs of said second voltage-to-current converting means; and a differential amplifier having first and second inputs connected to said differential outputs of said second voltage-to-current converting means.

3. A noise reduction circuit as claimed in claim 1, wherein said voltage buffer means comprises a differential amplifier having an inverting input terminal connected to said first differential input of said voltage-to-current converting means between said capacitance means and said feedback resistance means, a non-inverting input terminal connected to said second resistance means and an output terminal connected to said non-inverting input terminal and to said second resistance means.

* * * * *